(12) United States Patent
Tanaka et al.

(10) Patent No.: US 10,308,758 B2
(45) Date of Patent: Jun. 4, 2019

(54) FILLING MATERIAL FOR THREE-DIMENSIONAL MOUNTING OF SEMICONDUCTOR ELEMENT

(71) Applicant: DAICEL CORPORATION, Osaka-shi, Osaka (JP)

(72) Inventors: Hiroki Tanaka, Himeji (JP); Katsuhiro Nakaguchi, Himeji (JP)

(73) Assignee: DAICEL CORPORATION, Osaka-shi, Osaka (JP)

( * ) Notice: Subject to any disclaimer, the term of this patent is extended or adjusted under 35 U.S.C. 154(b) by 58 days.

(21) Appl. No.: 15/024,910

(22) PCT Filed: Sep. 25, 2014

(86) PCT No.: PCT/JP2014/075433
§ 371 (c)(1),
(2) Date: Mar. 25, 2016

(87) PCT Pub. No.: WO2015/046334
PCT Pub. Date: Apr. 2, 2015

(65) Prior Publication Data
US 2016/0237201 A1    Aug. 18, 2016

(30) Foreign Application Priority Data
Sep. 27, 2013 (JP) .................... 2013-201591

(51) Int. Cl.
*C08G 59/24* (2006.01)
*H01L 23/538* (2006.01)
(Continued)

(52) U.S. Cl.
CPC ......... *C08G 59/245* (2013.01); *C08G 59/226* (2013.01); *C08G 59/24* (2013.01);
(Continued)

(58) Field of Classification Search
CPC ............... C08G 59/226; C08G 59/245; C08G 59/4064; C08G 59/24; C08G 59/687;
(Continued)

(56) References Cited

U.S. PATENT DOCUMENTS 7,663,244 B2    2/2010    Kurita
7,812,457 B2    10/2010   Kurita
(Continued)

FOREIGN PATENT DOCUMENTS

JP    2006-019429 A    1/2006
JP    2007284475 A  *  11/2007  ............... C09K 3/10
(Continued)

OTHER PUBLICATIONS

Kuwabara, JP 2007-284475 A machine translation in English, Nov. 1, 2007.*

(Continued)

*Primary Examiner* — David T Karst
(74) *Attorney, Agent, or Firm* — Birch, Stewart, Kolasch & Birch, LLP

(57) ABSTRACT

Provided are a filling component useful for the production of a thin, low-profile three-dimensional integrated semiconductor device via a COW process, and a curable composition for the formation of the filling component. The filling component according to the present invention for three-dimensional mounting of semiconductor elements is used to fill gaps between laterally adjacent semiconductor elements in the production of a three-dimensional integrated semiconductor device by stacking and integrating semiconductor elements. The filling component is a component that is polished and/or ground flat from the front side of semiconductor elements while gaps between the semiconductor elements are filled with the filling component.

4 Claims, 2 Drawing Sheets

(51) Int. Cl.

| | | |
|---|---|---|
| *H01L 23/00* | (2006.01) | |
| *H01L 25/065* | (2006.01) | |
| *H01L 21/56* | (2006.01) | |
| *C08G 59/22* | (2006.01) | |
| *C08G 59/40* | (2006.01) | |
| *C08K 3/36* | (2006.01) | |
| *C08K 5/5425* | (2006.01) | |
| *H01L 23/29* | (2006.01) | |
| *H01L 23/31* | (2006.01) | |
| *C08G 59/68* | (2006.01) | |
| *C08L 63/00* | (2006.01) | |
| *H01L 21/78* | (2006.01) | |

(52) U.S. Cl.
CPC ....... *C08G 59/4064* (2013.01); *C08G 59/687* (2013.01); *C08K 3/36* (2013.01); *C08K 5/5425* (2013.01); *C08L 63/00* (2013.01); *H01L 21/561* (2013.01); *H01L 21/565* (2013.01); *H01L 23/295* (2013.01); *H01L 23/3142* (2013.01); *H01L 23/5389* (2013.01); *H01L 24/24* (2013.01); *H01L 24/82* (2013.01); *H01L 24/96* (2013.01); *H01L 25/0657* (2013.01); *H01L 21/568* (2013.01); *H01L 21/78* (2013.01); *H01L 23/293* (2013.01); *H01L 2224/04105* (2013.01); *H01L 2224/24146* (2013.01); *H01L 2224/32145* (2013.01); *H01L 2224/73267* (2013.01); *H01L 2224/9202* (2013.01); *H01L 2224/92244* (2013.01); *H01L 2225/06541* (2013.01); *H01L 2225/06548* (2013.01); *H01L 2924/18162* (2013.01)

(58) Field of Classification Search
CPC ..... H01L 23/5389; H01L 24/24; H01L 24/82; H01L 24/96; H01L 25/0657; H01L 21/561; H01L 21/565; H01L 23/295; H01L 23/3142; H01L 2224/24146; H01L 21/568; H01L 2224/04105; H01L 2224/32145; H01L 2224/73267; H01L 2224/9202; H01L 2224/92244; H01L 2924/18162; H01L 23/293; H01L 21/78; H01L 2225/06541; H01L 2225/06548; C08K 3/36; C08K 5/5425; C08L 63/00
USPC ........................................................ 523/443
See application file for complete search history.

(56) References Cited

U.S. PATENT DOCUMENTS

| | | |
|---|---|---|
| 2006/0014364 A1 | 1/2006 | Kurita |
| 2007/0278698 A1 | 12/2007 | Kurita |
| 2011/0104500 A1* | 5/2011 | Southwell .............. C08G 65/18 428/413 |
| 2014/0296437 A1 | 10/2014 | Hatae et al. |

FOREIGN PATENT DOCUMENTS

| | | | | |
|---|---|---|---|---|
| JP | 2011052116 A | * | 3/2011 | ........... G06K 9/6206 |
| JP | 2012-151109 A | | 8/2012 | |
| JP | 2012-209453 A | | 10/2012 | |
| JP | 2012-227441 A | | 11/2012 | |
| JP | 2013-118276 A | | 6/2013 | |
| JP | 2013-256634 A | | 12/2013 | |
| WO | WO 2012/133760 A1 | | 10/2012 | |
| WO | WO 2013/062123 A1 | | 5/2013 | |

OTHER PUBLICATIONS

Yamanoi et al., JP 2011-052116 A machine translation in English, Mar. 17, 2011 (Year: 2011).*
Mitsubishi Chemical, "jER Epoxy Resin Catalogue", Oct. 1, 2016 (Year: 2016).*
International Search Report (PCT/ISA/210) issued in PCT/JP2014/075433, dated Jan. 6, 2015.
Written Opinion (PCT/ISA/237) issued in PCT/JP2014/075433, dated Jan. 6, 2015.
Japanese Office Action, dated Jun. 5, 2018, for Japanese Application No. 2015-539334, with English machine translation.

* cited by examiner

FILLING MATERIAL FOR THREE-DIMENSIONAL MOUNTING OF SEMICONDUCTOR ELEMENT

TECHNICAL FIELD

The present invention relates to a filling component (filling material) for three-dimensional mounting of semiconductor elements, where the filling component is for use in a method for producing a three-dimensional integrated semiconductor device by stacking, assembling, and integrating semiconductor elements; and to a curable composition that is useful as a raw material for the filling component for three-dimensional mounting of semiconductor elements. The present application claims priority to Japanese Patent Application No. 2013-201591 filed Sep. 27, 2013 to Japan, the entire contents of which are incorporated herein by reference.

BACKGROUND ART

Semiconductor element integration techniques have shifted from two-dimensional integration techniques to three-dimensional integration techniques so as to provide for high degrees of integration of semiconductor devices. This causes semiconductor integrated circuit devices having a three-dimensional multilayer structure to receive attention. A chip-on-wafer process (COW process) (e.g., Patent Literature (PTL 1)) is known as a process for producing a three-dimensional integrated semiconductor circuit device. In the COW process, a second semiconductor wafer is diced to give chips, and the chips are stacked on a first semiconductor wafer. Assume that through holes (through-silicon vias; TSVs) are prepared in the COW process. In this case, the vias are prepared by performing etching using a photoresist.

CITATION LIST

Patent Literature

PTL 1: Japanese Unexamined Patent Application Publication (JP-A) No. 2006-19429

SUMMARY OF INVENTION

Technical Problem

However, when the chips diced from the second semiconductor wafer are stacked on the first semiconductor wafer, gaps are formed between chips that are laterally adjacent to each other. The gaps between the laterally adjacent chips have to be filled, because the presence of the gaps makes it difficult to apply the photoresist in a uniform thickness to the entire surface of the laminate including the first semiconductor wafer and the chips. However, the gaps, when merely filled typically by applying a resin, still remain as an uneven surface. In addition, the resin, if remained on the chip surface, leads to an increased thickness. Under these circumstances, demands have been made to provide filling materials (filling components) as follows. With the filling components, gaps (trenches) between laterally adjacent chips can be easily filled by coating. In addition, the filling components do not suffer from cracking and bubbles due to curing, do not suffer from cracking and separation even after subjected to a flattening or thinning treatment, and have excellent workability.

Accordingly, the present invention has an object to provide a filling component (filling material) that is useful for the production of a thin, low-profile three-dimensional integrated semiconductor device via a COW process, and to provide a curable composition to form the filling component.

Solution to Problem

After intensive investigations to achieve the object, the inventors of the present invention have found that, in a method for producing a three-dimensional integrated semiconductor device (e.g., a three-dimensional integrated semiconductor circuit device) via the COW process, the chip surface can be easily flattened by filling gaps between laterally adjacent chips with a filling component, and polishing or grinding the filling component in this state from the front side. The present invention has been made based on these findings.

Specifically, the present invention provides, in an embodiment, a filling component for three-dimensional mounting of semiconductor elements. The filling component is used for filling gaps between laterally adjacent semiconductor elements in production of a three-dimensional integrated semiconductor device by stacking and integrating semiconductor elements. The filling component is a component (member) that is polished and/or ground flat from a front side of the semiconductor elements while the gaps between the semiconductor elements are filled with the filling component.

The filling component for three-dimensional mounting of semiconductor elements may be a cured product of a curable composition, where the curable composition contains an epoxide having a bisphenol skeleton, and a cationic-polymerization initiator.

The present invention provides, in another embodiment, a curable composition for three-dimensional mounting of semiconductor elements. The curable composition is used to form the filling component for three-dimensional mounting of semiconductor elements. The curable composition contains a cationic-polymerization initiator and an epoxide having a bisphenol skeleton and is liquid at 25° C.

The curable composition for three-dimensional mounting of semiconductor elements may further contain a cycloaliphatic epoxide.

The curable composition for three-dimensional mounting of semiconductor elements may further contains at least one filler selected from the group consisting of inorganic fillers and organic fillers each having an average particle diameter of 0.05 to 1 μm.

The curable composition for three-dimensional mounting of semiconductor elements may further contain a silane coupling agent.

Specifically, the present invention relates to followings.

(1) The present invention relates to a filling component for three-dimensional mounting of semiconductor elements. The filling component is used for filling gaps between laterally adjacent semiconductor elements in the production of a three-dimensional integrated semiconductor device by stacking and integrating semiconductor elements. The filling component is a component that is polished and/or ground flat from the semiconductor element front side while the gaps between the semiconductor elements are filled with the filling component.

(2) The filling component according to (1) for three-dimensional mounting of semiconductor elements may be a cured product of a curable composition, where the curable composition contains a cationic-polymerization initiator and an epoxide having a bisphenol skeleton.

(3) In the filling component according to (2) for three-dimensional mounting of semiconductor elements, the cured product of the curable composition may have a glass transition temperature of 30° C. or higher.

(4) In the filling component according to one of (2) and (3) for three-dimensional mounting of semiconductor elements, the cured product of the curable composition may have a coefficient of thermal expansion of 150 (ppm/K) or less.

(5) The present invention also relates to a curable composition for three-dimensional mounting of semiconductor elements. The curable composition is used to form the filling component according to any one of (1) to (4) for three-dimensional mounting of semiconductor elements. The curable composition contains a cationic-polymerization initiator, and a curable compound including an epoxide having a bisphenol skeleton. The curable composition is liquid at 25° C.

(6) In the curable composition according to (5) for three-dimensional mounting of semiconductor elements, the epoxide having a bisphenol skeleton may be at least one selected from the group consisting of compounds represented by Formulae (1) to (3).

(7) In the curable composition according to one of (5) and (6) for three-dimensional mounting of semiconductor elements, the epoxide having a bisphenol skeleton may have an epoxy equivalent of 155 to 800 g/eq.

(8) The curable composition according to any one of (5) to (7) for three-dimensional mounting of semiconductor elements may further contain a cycloaliphatic epoxide.

(9) In the curable composition according to (8) for three-dimensional mounting of semiconductor elements, the cycloaliphatic epoxide may be a compound represented by Formula (4).

(10) In the curable composition according to (8) for three-dimensional mounting of semiconductor elements, the cycloaliphatic epoxide may be at least one selected from the group consisting of compounds represented by Formulae (4-1) to (4-6).

(11) The curable composition according to any one of (5) to (10) for three-dimensional mounting of semiconductor elements may contain 30% to 99.99% by weight of the curable compound based on the total amount (100% by weight) of the curable composition.

(12) The curable composition according to any one of (5) to (11) for three-dimensional mounting of semiconductor elements may contain the epoxide having a bisphenol skeleton in a proportion of 30% by weight or more relative to all curable compounds contained in the curable composition.

(13) In the curable composition according to any one of (5) to (12) for three-dimensional mounting of semiconductor elements, the total proportion of the epoxide having a bisphenol skeleton and a cycloaliphatic epoxide may be 50% by weight or more of all the curable compound(s) contained in the curable composition.

(14) In the curable composition according to (8) to (13) for three-dimensional mounting of semiconductor elements, the ratio (in part by weight) of the epoxide having a bisphenol skeleton to the cycloaliphatic epoxide may be from 55:45 to 99:1.

(15) The curable composition according to any one of (5) to (14) for three-dimensional mounting of semiconductor elements may contain 0.01 to 15 parts by weight of the cationic-polymerization initiator per 100 parts by weight of the curable compound(s) (preferably cationically curable compound(s), and particularly preferably epoxide(s)) contained in the curable composition.

(16) The curable composition according to any one of (5) to (15) for three-dimensional mounting of semiconductor elements may further contain at least one filler selected from the group consisting of inorganic fillers and organic fillers each having an average particle diameter of 0.05 to 1 μm.

(17) The curable composition according to (16) for three-dimensional mounting of semiconductor elements may contain 0.1 to 70 parts by weight of the at least one of the inorganic fillers and organic fillers per 100 parts by weight of the curable compound(s) (preferably cationically curable compound(s), and particularly preferably epoxide(s)).

(18) The curable composition according to any one of (5) to (17) for three-dimensional mounting of semiconductor elements may further contain a silane coupling agent.

(19) The curable composition according to (18) for three-dimensional mounting of semiconductor elements may contain 0.1 to 10 parts by weight of the silane coupling agent per 100 parts by weight of the curable compound(s) (preferably cationically curable compound(s), and particularly preferably epoxide(s)).

(20) In the curable composition according to one of (18) and (19) for three-dimensional mounting of semiconductor elements, the total in contents of the epoxides, cationic-polymerization initiators, inorganic fillers, organic fillers, and silane coupling agents is 80% by weight or more based on the total amount of the curable composition.

(21) The curable composition according to any one of (5) to (20) for three-dimensional mounting of semiconductor elements may have a viscosity (at 25° C.) of 10 to 100000 mPa·s.

(22) The present invention also relates to a method for producing a three-dimensional integrated semiconductor device. The method includes the steps of filling space (gaps) between semiconductor elements with a cured product of the curable composition according to any one of (5) to (21) for three-dimensional mounting of semiconductor elements, and polishing and/or grinding flat the cured product from the semiconductor element front side while the space between semiconductor elements is filled with the cured product.

(23) The present invention also relates to a three-dimensional integrated semiconductor device produced by the method according to (22) for producing a three-dimensional integrated semiconductor device.

Advantageous Effects of Invention

With the present invention, the filling component is polished from the front side of semiconductor elements while gaps between the laterally adjacent thinned semiconductor elements are filled with the filling component. This flattens the chip front side and produces a thin, low-profile three-dimensional integrated semiconductor device in a good yield.

DESCRIPTION OF EMBODIMENTS

Filling Component for Three-Dimensional Mounting of Semiconductor Elements

The filling component according to the present invention for three-dimensional mounting of semiconductor elements is hereinafter also simply referred to as an "filling component". The filling component is a filling component (gap-filling component) that is used for filling gaps between laterally adjacent semiconductor elements in production of a three-dimensional integrated semiconductor device by stacking and integrating semiconductor elements. The filling component is polished or ground flat from the front side of the semiconductor elements while the gaps between the semiconductor elements are filled with the filling component.

Figure 1:
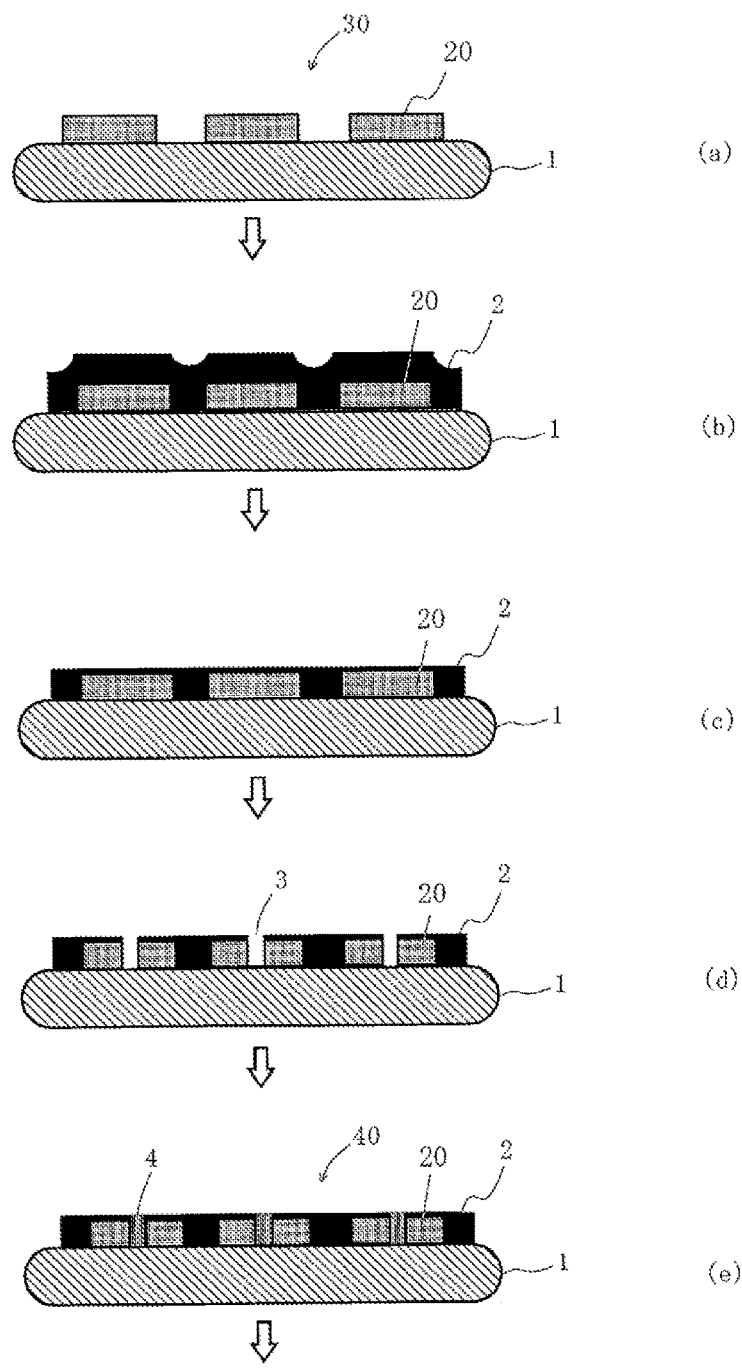
FIG. 1 is a schematic process chart illustrating an exemplary method for producing a three-dimensional integrated semiconductor device using a filling component according to the present invention for three-dimensional mounting of semiconductor elements.
Figure 2:
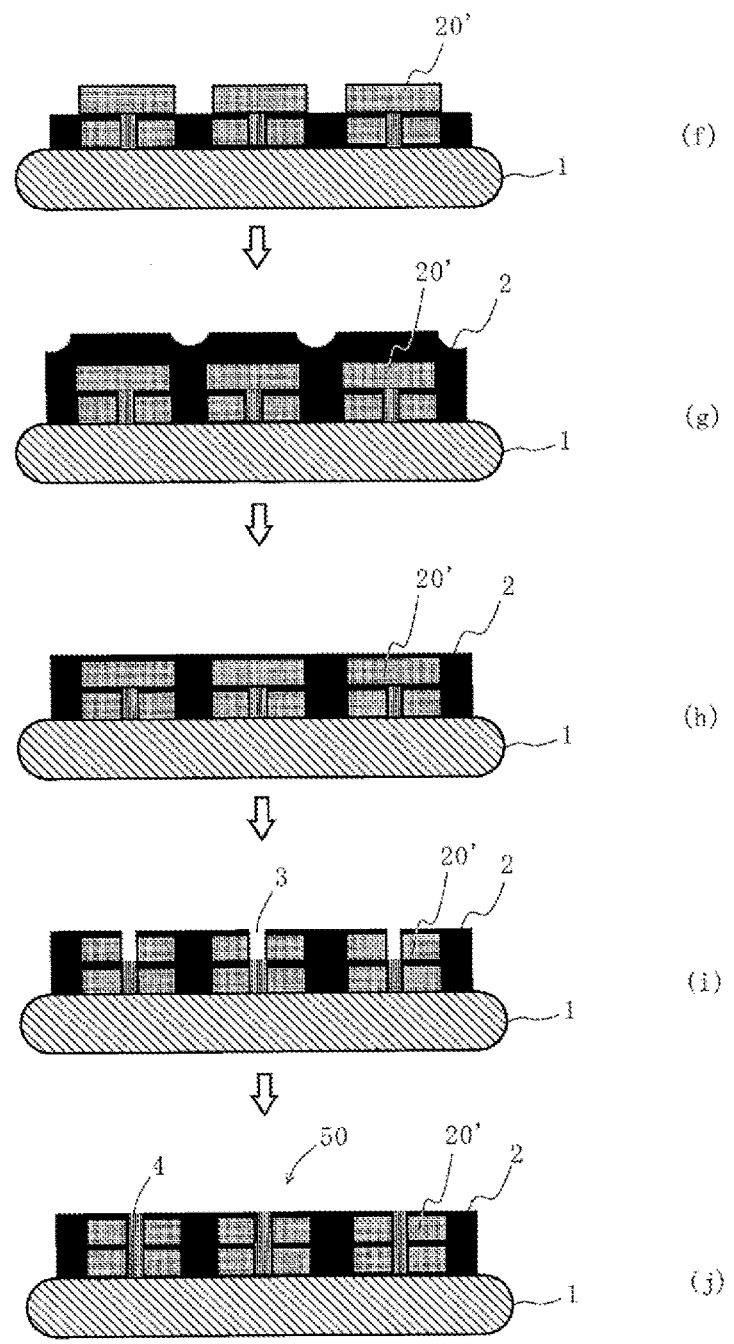
FIG. 2 is a schematic process chart (continued from FIG. 1) illustrating the exemplary method for producing a three-dimensional integrated semiconductor device using the filling component according to the present invention for three-dimensional mounting of semiconductor elements.

FIGS. 1 and 2 are a schematic process chart illustrating an exemplary method for producing a three-dimensional integrated semiconductor device (three-dimensional integrated semiconductor circuit device) using a filling component according to the present invention for three-dimensional mounting of semiconductor elements. In this process, a three-dimensional integrated semiconductor device may be produced in the following manner.

In Step (a), a first base wafer 30 is prepared. The first base wafer 30 includes a silicon wafer 1 and semiconductor elements 20 stacked on the silicon wafer 1, where the silicon wafer 1 includes circuit-forming regions.

In Step (b), gaps between adjacent semiconductor elements 20 are filled with the filling component 2 according to the present invention for three-dimensional mounting of semiconductor elements (an after-mentioned curable composition for three-dimensional mounting of semiconductor elements is poured into the gaps and cured).

In Step (c), the filling component 2 is polished and/or ground on the surface (front side) to be flattened and thinned.

In Steps (d) and (e), through holes 3 are formed in the semiconductor elements 20 or in the filling component 2 for three-dimensional mounting of semiconductor elements, and through-silicon vias 4 are formed in the through holes 3 to give a semiconductor wafer 40.

In Steps (f) to (j), semiconductor elements 20' are stacked on the semiconductor wafer 40, which is obtained in the above manner and has two interconnection layers, and the above-mentioned steps are repeated to give a semiconductor wafer 50 having three interconnection layers.

The operation as above is repeated in a desired number, and the work is diced at desired positions to give three-dimensional integrated semiconductor devices (three-dimensional integrated semiconductor circuit devices).

The polishing and/or grinding in Step (c) is preferably performed so that the filling component 2 has a thickness of typically 10 to 30 μm.

As described above, the filling component is polished or ground from the elements front side while the gaps between laterally adjacent elements are filled with the filling component. This flattens the elements front side and efficiently gives a low-profile three-dimensional integrated semiconductor device (three-dimensional integrated semiconductor circuit device) in which the elements themselves are thinned. During the process, the formation of cracks and bubbles is eliminated or minimized.

The semiconductor elements 20 are elements using a semiconductor and may be selected typically from MEMSs and image sensors. The semiconductor elements 20' to be stacked may have dimensions (length, width, and height) identical to or different from the dimensions of the semiconductor elements 20.

The silicon wafer 1 including the circuit-forming regions may be a MEMS or an image sensor.

The filling component 2 is preferably a cured product of a curable composition containing a cationic-polymerization initiator and an epoxide having a bisphenol skeleton.

Curable Composition for Three-Dimensional Mounting of Semiconductor Elements

The curable composition according to the present invention for three-dimensional mounting of semiconductor elements is hereinafter also referred to as a "curable composition according to the present invention". The curable composition (molding compound) contains a cationic-polymerization initiator and an epoxide having a bisphenol skeleton and is liquid at 25° C. The curable composition according to the present invention is usable to form the filling component for three-dimensional mounting of semiconductor elements. Specifically, the curable composition according to the present invention, when poured into gaps between laterally adjacent elements and cured, forms the filling component.

Curable Compound

The curable composition according to the present invention contains an epoxide having a bisphenol skeleton, which serves as a curable compound (in particular, a cationically curable compound). The curable composition, as using the epoxide having a bisphenol skeleton as a curable compound, resists cracking upon curing, resists cracking and chipping and does not cause grinder plugging even upon polishing after curing. In contrast, a conventional adhesive for element stacking, if diverted for the gap-filling component (filling component), suffers from cracking and/or chipping and/or causes grinder plugging upon curing and upon polishing after curing. A curable composition containing a cycloaliphatic epoxide alone as the curable compound causes its cured product to be an excessively hard and/or undergoes cure shrinkage to often cause the cured product to be cracked.

Examples of the epoxide having a bisphenol skeleton include, but are not limited to, epoxides having a bisphenol-A skeleton (i.e., bisphenol-A epoxy resins), epoxides having a bisphenol-F skeleton (i.e., bisphenol-F epoxy resins), epoxides having a bisphenol-AD skeleton (i.e., bisphenol-AD epoxy resins), and epoxides having a bisphenol-S skeleton (i.e., bisphenol-S epoxy resins). Each of these epoxides may include, in the molecule, a constitutional unit other than constitutional units derived from bisphenol and epichlorohydrin.

Representative, but non-limiting examples of the epoxide having a bisphenol skeleton includes compounds represented by Formulae (1), (2), and (3):

[Chem. 1]

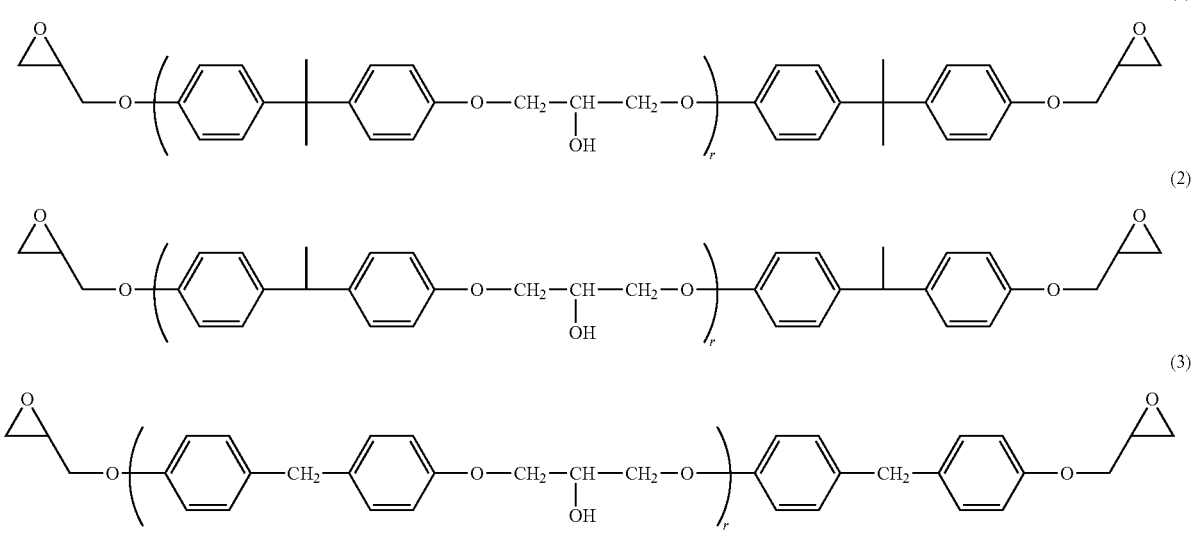

In the formulae, r represents a number of 0 to 8. In particular, r is preferably from 0.01 to 3 and particularly preferably from 1 to 2.

The epoxide having a bisphenol skeleton has an epoxy equivalent of typically 155 to 800 g/eq, preferably 155 to 500 g/eq, particularly preferably 160 to 200 g/eq, and most preferably 160 to 190 g/eq. The epoxide having a bisphenol skeleton is preferably a compound that is liquid at room temperature (25° C.). However, an epoxide having a bisphenol skeleton and being solid at room temperature may be used herein in combination with another compound (e.g., another epoxide) that dissolves the epoxide having a bisphenol skeleton therein and is liquid at 25° C., so as to allow the curable compounds as a whole to be liquid at 25° C.

The curable composition according to the present invention may further contain an epoxide other than the epoxide having a bisphenol skeleton. Non-limiting examples of such other epoxides include cycloaliphatic epoxides, i.e., epoxides each containing a cycloaliphatic epoxy group in the molecule, where the cycloaliphatic epoxy group is an epoxy group including an oxygen atom and adjacent two carbon atoms constituting an alicycle; epoxides containing an alicycle and an epoxy group directly bonded to the alicycle via a single bond; glycidyl ether epoxides containing an alicycle and a glycidyl ether group; and any other epoxides.

Examples of the alicycle include, but are not limited to, monocyclic alicycles (e.g., cycloalkane rings containing 3 to 15 members, preferably about 5 or about 6 members), such as cyclopentane, cyclohexane, cyclooctane, and cyclododecane rings; and polycyclic (including about two to about four rings) alicycles (bridged carbon rings) such as decahydronaphthalene (perhydronaphthalene), perhydroindene (bicyclo[4.3.0]nonane), perhydroanthracene, perhydrofluorene, perhydrophenanthrene, perhydroacenaphthene, perhydrophenalene, norbornane (bicyclo[2.2.1]heptane), isobornane, adamantane, bicyclo[3.3.0]octane, tricyclo[5.2.1.0$^{2,6}$]decane, and tricyclo[6.2.1.0$^{2,7}$]undecane rings. Examples of the cycloaliphatic epoxy group include, but are not limited to, epoxycyclopentyl, 3,4-epoxycyclohexyl, and 3,4-epoxytricyclo[5.2.1.0$^{2,6}$]dec-8- (or -9-)yl groups (epoxidized dicyclopentadienyl groups). The alicycle may bear one or more substituents bonded thereto. Examples of the substituents include, but are not limited to, $C_1$-$C_6$ alkyl groups such as methyl group.

Non-limiting examples of the cycloaliphatic epoxide include compounds represented by Formula (4), where the compounds each contain two cycloaliphatic epoxy groups bonded to each other via a single bond or a linkage group.

[Chem. 2]

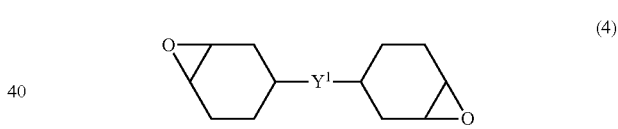

In the formula, $Y^1$ is selected from a single bond and a linkage group. Examples of the linkage group include, but are not limited to, divalent hydrocarbon groups, carbonyl group (—CO—), ether bond (—O—), ester bond (—COO—), amide bond (—CONH—), carbonate bond (—OCOO—), and groups each including two or more of them bonded to each other. Examples of the divalent hydrocarbon groups include, but are not limited to, straight or branched chain alkylene groups such as methylene, ethylidene, isopropylidene, ethylene, propylene, trimethylene, and tetramethylene groups, of which $C_1$-$C_6$ alkylene groups are typified; divalent alicyclic hydrocarbon groups such as 1,2-cyclopentylene, 1,3-cyclopentylene, cyclopentylidene, 1,2-cyclohexylene, 1,3-cyclohexylene, 1,4-cyclohexylene, and cyclohexylidene groups, of which divalent cycloalkylene groups are typified; and groups each including two or more of them bonded to each other.

Typical, but non-limiting examples of the compounds represented by Formula (4) include (3,4,3',4'-diepoxy)bicyclohexyl, bis(3,4-epoxycyclohexylmethyl) ether, 1,2-epoxy-1,2-bis(3,4-epoxycyclohex-1-yl)ethane, 2,2-bis(3,4-epoxycyclohex-1-yl)propane, 1,2-bis(3,4-epoxycyclohex-1-yl)ethane, and compounds represented by Formulae (4-1) to (4-6). In the formula, t represents an integer of 1 to 30.

[Chem. 3]

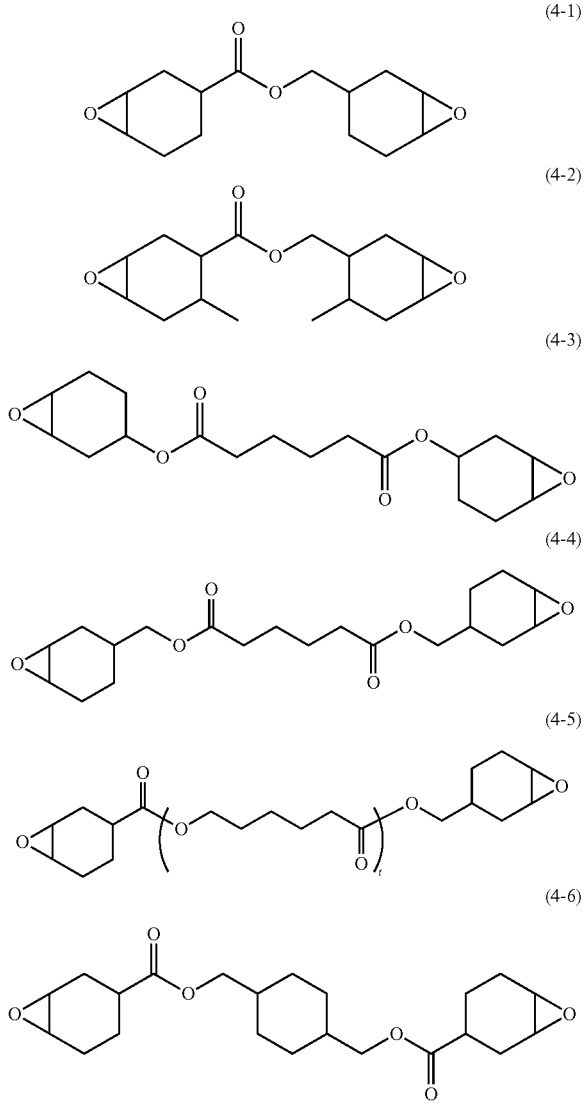

(4-1)
(4-2)
(4-3)
(4-4)
(4-5)
(4-6)

Examples of the cycloaliphatic epoxide further include compounds containing an alicycle and two or more epoxy groups, where only one of the two or more epoxy groups is a cycloaliphatic epoxy group. A typical, but non-limiting example of the compounds is limonene diepoxide represented by Formula (5):

[Chem. 4]

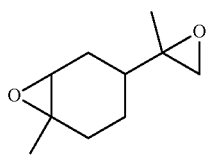

(5)

Examples of the cycloaliphatic epoxide usable herein also include cycloaliphatic epoxides containing three or more cycloaliphatic epoxy groups, and cycloaliphatic epoxides containing only one cycloaliphatic epoxy group, but no other epoxy groups, such as compounds represented by Formulae (6) to (9) below. In the formulae, a, b, c, d, e, f each represent an integer of 0 to 30.

[Chem. 5]

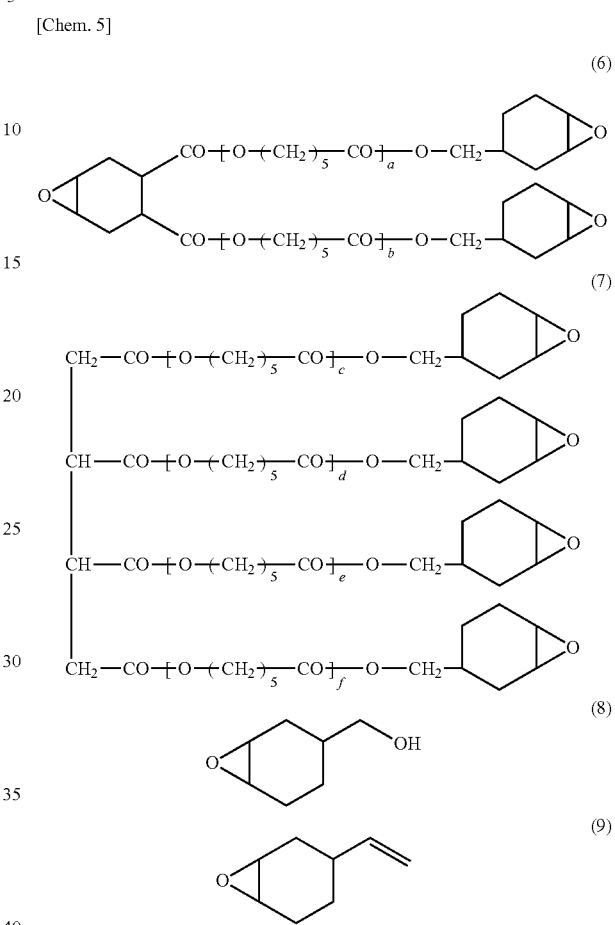

(6)
(7)
(8)
(9)

Non-limiting examples of the epoxides containing an alicycle and an epoxy group directly bonded to the alicycle via a single bond include compounds represented by Formula (10):

[Chem. 6]

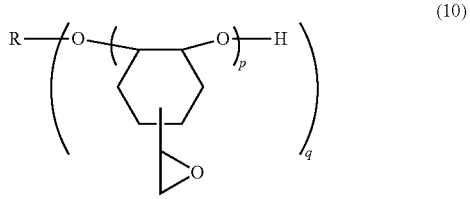

(10)

In the formula, R represents a group corresponding to a q-hydric (q-valent) alcohol $(R-(OH)_q)$, except for removing OH in a number of q from the alcohol; p represents an integer of 1 to 30; and q represents an integer of 1 to 10. In "q" occurrence(s) of the group in the brackets, occurrences of p may be identical to or different from each other. Examples of the q-hydric alcohol (R—(OH)q) include, but are not limited to, monohydric alcohols such as methanol, ethanol, 1-propanol, isopropyl alcohol, and 1-butanol; dihydric alcohols such as ethylene glycol, 1,2-propanediol, 1,3-propanediol, 1,4-butanediol, neopentyl glycol, 1,6-hexanediol, diethylene glycol, triethylene glycol, tetraethylene glycol, dipropylene glycol, and poly(propylene glycol)s; and trihydric or higher alcohols such as glycerol, diglycerol, erythritol, trimethylolethane, trimethylolpropane, pentaerythritol, dipentaerythritol, and sorbitol. The alcohol may also be selected from polyether polyols, polyester polyols, polycarbonate polyols, and polyolefin polyols. The alcohol is preferably selected from $C_1$-$C_{10}$ aliphatic alcohols (and particularly preferably selected from aliphatic polyhydric alcohols such as trimethylolpropane).

Non-limiting examples of the glycidyl ether epoxides containing an alicycle and a glycidyl ether group include glycidyl ethers of alicyclic alcohols (in particular, alicyclic polyhydric alcohols). The compounds may also be compounds corresponding to the epoxides having a bisphenol skeleton (e.g., the compounds represented by Formulae (1), (2), and (3)), except with their aromatic rings being nuclear hydrogenated.

Examples of the other epoxides include, but are not limited to, glycidyl ethers of the q-hydric alcohol (R—$(OH)_q$); glycidyl esters of mono- or poly-carboxylic acids such as acetic acid, propionic acid, butyric acid, stearic acid, adipic acid, sebacic acid, maleic acid, and itaconic acid; epoxidized products of fats and oils containing a double bond, such as epoxidized linseed oil, epoxidized soybean oil, and epoxidized castor oil; and epoxidized products of polyolefins (including polyalkadienes), such as epoxidized polybutadienes.

Of the other epoxides than the epoxide having a bisphenol skeleton, preferred are cycloaliphatic epoxides. The combination use of the epoxide having a bisphenol skeleton with such a cycloaliphatic epoxide allows the cured product (filling component 2) to have better heat resistance and to less vary in hardness in high-temperature environments.

The curable composition according to the present invention may further contain any other curable compounds in addition to the epoxides, but the curable composition may contain the epoxides in a proportion of typically 50% by weight or more, preferably 70% by weight or more, particularly preferably 85% by weight or more, and most preferably 90% by weight or more, relative to all the curable compounds (in particular, all cationically curable compounds) contained in the curable composition according to the present invention. The upper limit of the epoxide proportion is 100% by weight.

The curable composition according to the present invention may contain curable compound(s) in a content of typically 30% to 99.99% by weight, preferably 50% to 99.9% by weight, and more preferably 60% to 99.5% by weight. When the curable composition contains two or more curable compounds, the "content" refers to the total content of them.

The curable composition according to the present invention may contain epoxide(s) in a content of typically 30% to 99.99% by weight, preferably 50% to 99.9% by weight, and more preferably 60% to 99.5% by weight. When the curable composition contains two or more epoxides, the "content" refers to the total content of them.

The proportion of the epoxide having a bisphenol skeleton is typically 30% by weight or more, preferably 40% by weight or more, more preferably 50% by weight or more, and particularly preferably 70% by weight or more, of all the curable compound(s) in the curable composition according to the present invention.

The proportion of the epoxide having a bisphenol skeleton is typically 30% by weight or more, preferably 40% by weight or more, more preferably 50% by weight or more, and particularly preferably 70% by weight or more, of all the epoxide(s) in the curable composition according to the present invention.

The total proportion of the epoxide having a bisphenol skeleton and the cycloaliphatic epoxide is typically 50% by weight or more, preferably 70% by weight or more, and more preferably 90% by weight or more, of all the curable compound(s) in the curable composition according to the present invention.

The total proportion of the epoxide having a bisphenol skeleton and the cycloaliphatic epoxide is typically 50% by weight or more, preferably 70% by weight or more, and more preferably 90% by weight or more, of all epoxides in the curable composition according to the present invention.

The ratio (in part by weight) of the epoxide having a bisphenol skeleton to the cycloaliphatic epoxide in the curable composition according to the present invention is typically from 55:45 to 99:1, preferably from 60:40 to 95:5, and more preferably from 70:30 to 90:10.

Cationic-Polymerization Initiator

The curable composition according to the present invention contains a cationic-polymerization initiator (curing catalyst). The cationic-polymerization initiator is a compound that releases a substance by the application of light or heat, where the substance initiates cationic polymerization.

Of such cationic-polymerization initiators, non-limiting examples of cationic-polymerization initiators that generate a cationic species by the application of light include triarylsulfonium salts such as hexafluoroantimonate salts, pentafluorohydroxyantimonate salts, hexafluorophosphate salts, and hexafluoroarsenate salts; and preferably usable are commercial products available typically under the trade names CPI-100P, CPI-101A, and LW-S1 (each from San-Apro Ltd.), the trade names CD-1010, CD-1011, and CD-1012 (each from Sartomer USA, LLC), the trade name IRGACURE 264 (from BASF SE), and the trade name CIT-1682 (from Nippon Soda Co., Ltd.).

Of the cationic-polymerization initiators, non-limiting examples of the cationic-polymerization initiators that generate a cationic species by the application of heat include aryldiazonium salts, aryliodonium salts, arylsulfonium salts, and arene-ion complexes; and preferably usable are commercial products available typically under the trade names PP-33, CP-66, and CP-77 (each from ADEKA CORPORATION), the trade name FC-509 (from 3M Company), the trade name UVE1014 (from G.E.), the trade names San-Aid SI-60L, San-Aid SI-80L, San-Aid SI-100L, and San-Aid SI-110L (each from SANSHIN CHEMICAL INDUSTRY CO., LTD.), and the trade name CG-24-61 (from BASF SE). The cationic-polymerization initiator may also be selected from compounds between a chelate compound and a silanol; and compounds between a chelate compound and a phenol, where the chelate compound is of a metal such as aluminum or titanium with acetoacetic acid or a diketone; the silanol is exemplified by, but not limited to, triphenylsilanol; and the phenol is exemplified by, but not limited to, bisphenol-S.

The curable composition according to the present invention, as containing the cationic-polymerization initiator, is cationically cured by the application of heat or light to form the filling component.

The blending amount of the cationic-polymerization initiator is not limited, but is preferably 0.01 to 15 parts by weight, more preferably 0.05 to 10 parts by weight, furthermore preferably 0.1 to 8 parts by weight, particularly preferably 0.1 to 5 parts by weight, and most preferably 0.1 to 3 parts by weight, per 100 parts by weight of all curable compounds (preferably all cationically curable compounds, and particularly preferably all epoxides) in the curable composition. The curable composition, when containing the cationic-polymerization initiator in an amount within the range, gives a cured product (filling component) that is good in properties such as heat resistance, transparency, and weatherability.

Additives

The curable composition according to the present invention may contain at least one selected from inorganic fillers and organic fillers. The curable composition, when containing at least one selected from inorganic fillers and organic fillers, allows the cured product (filling component 2) to less thermally expand and to have better heat resistance.

Examples of the inorganic fillers include, but are not limited to, silica, alumina, magnesia, titania, antimony oxide, talc, clay, montmorillonite, hydrotalcite, synthetic mica, calcium carbonate, aluminum hydroxide, and magnesium hydroxide. The curable composition may contain each of them alone or in combination. Among them, silica (in particular, spheroidal silica) and alumina are preferred.

The inorganic fillers may each have an average particle diameter of typically 0.05 to 1 μm, and preferably 0.1 to 1 μm.

The blending amount of the inorganic filler(s) is typically 70 parts by weight or less (e.g., 0.1 to 70 parts by weight), preferably 50 parts by weight or less (e.g., 1 to 50 parts by weight), and more preferably 40 parts by weight or less (e.g., 5 to 40 parts by weight), per 100 parts by weight of all curable compounds (preferably all cationically curable compounds, and particularly preferably all epoxides) in the curable composition according to the present invention.

Examples of the organic fillers include, but are not limited to, polyimides, poly(ether ether ketone)s, aramids, and cellulose. The curable composition may contain each of them alone or in combination. Among them, preferred are polyimides (in particular, spheroidal polyimides) and poly(ether ether ketone)s (in particular, spheroidal poly(ether ether ketone)s).

The blending amount of the organic filler(s) is typically 70 parts by weight or less (e.g., 0.1 to 70 parts by weight), preferably 50 parts by weight or less (e.g., 1 to 50 parts by weight), and more preferably 40 parts by weight or less (e.g., 5 to 40 parts by weight), per 100 parts by weight of all curable compounds (preferably all cationically curable compounds, and particularly preferably all epoxides) in the curable composition according to the present invention.

The curable composition according to the present invention may contain a silane coupling agent. The curable composition, when containing the silane coupling agent, allows the cured product (filling component 2) to have better adhesion to a silicon wafer.

Non-limiting examples of the silane coupling agent include 3-trimethoxysilylpropyl (meth)acrylate, 3-triethoxysilylpropyl (meth)acrylate, 3-dimethoxymethylsilylpropyl (meth)acrylate, and 3-diethoxymethylsilylpropyl (meth)acrylate. When a silane coupling agent containing a (meth) acryloyloxy group as a functional group is used, the curable composition may further contain a small amount of a radical polymerization initiator. The curable composition may contain any of silane coupling agents containing an epoxy group as a functional group, such as 2-(3,4-epoxycyclohexyl) ethyltrimethoxysilane, 3-glycidoxypropylmethyldimethoxysilane, 3-glycidoxypropyltrimethoxysilane, 3-glycidoxypropylmethyldiethoxysilane, and 3-glycidoxypropyltriethoxysilane. The coupling agents of this type, however, belong to the other epoxides.

The blending amount of the silane coupling agent(s) is typically 10 parts by weight or less (e.g., 0.1 to 10 parts by weight), preferably 5 parts by weight or less (e.g., 0.2 to 5 parts by weight), and more preferably 3 parts by weight or less (e.g., 0.3 to 3 parts by weight), per 100 parts by weight of all curable compounds (preferably all cationically curable compounds, and particularly preferably all epoxides) in the curable composition according to the present invention.

The curable composition according to the present invention may further contain one or more additives as needed within ranges not adversely affecting the advantageous effects of the present invention. Examples of the additives include, but are not limited to, silicone- or fluorine-containing antifoaming agents, leveling agents, surfactants, organic rubber particles, flame retardants, colorants, plasticizers, antistatic agents, antioxidants, ultraviolet absorbers, photostabilizers, ion adsorbents, pigments, dyestuffs, and phosphors. The blending amount of each category of the additives is typically 5% by weight or less based on the total amount of the curable composition. The curable composition according to the present invention may contain a solvent. The amount of the solvent is preferably typically 20% by weight or less, more preferably 10% by weight or less, particularly preferably 5% by weight or less, and most preferably 1% by weight or less, based on the total amount of the curable composition. The range is preferred because an excessively large amount of the solvent may cause the cured product to include bubbles.

The total content of the epoxides, cationic-polymerization initiators, inorganic fillers, organic fillers, and silane coupling agents in the curable composition according to the present invention is typically 80% by weight or more, preferably 90% by weight or more, particularly preferably 95% by weight or more, and most preferably 99% by weight or more, of the total amount of the curable composition.

The curable composition according to the present invention is liquid at 25° C. and has a viscosity (25° C.) of typically 10 to 100000 mPa·s, preferably 100 to 10000 mPa·s, particularly preferably 500 to 10000 mPa·s, and most preferably 500 to 3000 mPa·s. The curable composition according to the present invention is preferably in the form of a paste being fluid at room temperature. The curable composition according to the present invention, if having an excessively high viscosity, may impede bubble escaping and may readily suffer from deterioration in properties such as workability and handleability. The viscosity may be measured using a viscometer such as a Brookfield type viscometer or a type D viscometer.

The curable composition according to the present invention may be any of a one-part composition and a two-part composition.

The curable composition according to the present invention may be prepared by mixing and stirring the epoxide having a bisphenol skeleton and the cationic-polymerization initiator and, as needed, any optional components such as the cycloaliphatic epoxide, the inorganic or organic filler, the silane coupling agent, and any other additives. The mixing and stirring may be performed with an apparatus such as a general-purpose mixer or kneader.

The curable composition for three-dimensional mounting of semiconductor elements prepared in the above manner may be used in the production of a three-dimensional integrated semiconductor device. Specifically, the curable composition is poured into gaps between laterally adjacent semiconductor elements, cured (photo-cured or thermally cured) under predetermined conditions, and functions as the filling component 2.

Assume that the curable composition according to the present invention is photo-cured (photo-cationically cured). In this case, non-limiting examples of the active energy ray (light) to be applied include ultraviolet rays and electron beams, of which ultraviolet rays are preferred. The wavelength of the ultraviolet rays to be applied may be selected as appropriate according typically to the type of the cationic-polymerization initiator. The active energy ray irradiation conditions may be selected as appropriate according typically to the type and thickness of the blended epoxide(s) and the type and amount of the blended cationic-polymerization initiator. Typically, assume that an ultraviolet ray is applied. In this case, the radiant exposure (dose) of the ultraviolet ray is preferably 10 to 30000 mJ/cm$^2$, and particularly preferably 50 to 25000 mJ/cm$^2$. Examples of the ultraviolet ray irradiation source include, but are not limited to, high-pressure mercury lamps, ultra-high pressure mercury lamps, xenon lamps, carbon arc, metal halide lamps, sunlight, and LED lamps.

After being irradiated with the active energy ray to be photo-cured in the above manner, the curable composition according to the present invention may further be subjected to heating (postcuring) as needed. Advantageously, the postcuring effectively reduces amounts of unreacted components in the cured product, allows the cured product to be cured with a higher degree of cure, relaxes the strain, and offers any other effects. In addition, postcuring may effectively allow the cured product to have better hardness and better adhesion. The heating may generally be performed at a temperature of 100° C. to 200° C. for 1 to 300 minutes.

Assume that the curable composition according to the present invention is thermally cured (thermally cationically cured). In this case, the curing is performed at a temperature of typically about 45° C. to about 200° C. for a time of typically about 1 to about 60 minutes. The thermal curing may also be performed in multiple steps.

Of the curing systems, the photo-curing is more preferred than the thermal curing. This is because as follows. Assume that the curable composition is poured into the gaps between adjacent semiconductor elements, and heat is applied to the curable composition to cure the composition. In this case, the curable composition may have higher fluidity due to heat, gather in the center, and suffer from uneven in-plane thickness distribution. This is because the curable composition has low wettability with the silicon wafer.

The cured product of the curable composition according to the present invention has excellent toughness and resists cracking and chipping even subjected to a polishing process. In addition, the cured product of the curable composition according to the present invention has excellent heat resistance and has a glass transition temperature (Tg in degree Celsius) of typically 30° C. or higher, preferably 50° C. or higher, and particularly preferably 80° C. or higher. The cured product has a coefficient of thermal expansion of typically 150 ppm/K or less, and preferably 100 ppm/K or less.

EXAMPLES

The present invention will be illustrated in further detail with reference to several examples below. It should be noted, however, that the examples are by no means intended to limit the scope of the present invention.

Example 1

Materials, i.e., 100 parts by weight of a bisphenol-F epoxy resin and 2 parts by weight of cationic-polymerization initiator CPI-100P, were mixed and stirred using a planetary centrifugal mixer (trade name AWATORIRENTARO (Thinky Mixer), supplied by THINKY CORPORATION) and yielded a curable composition for a filling component (filling-component curable composition).

Examples 2 to 24 and Comparative Examples 1 to 4

Filling-component curable compositions were prepared by a procedure similar to Example 1, except for employing formulations as given in Table 1.

Evaluation Tests

A coating substrate was prepared by cutting an 8-inch silicon wafer to have protrusions and depressions simulating chips. This was a simulated COW substrate having a wafer thickness of 725 μm, including chip portions of 9 mm long by 9 mm wide by 0.2 mm thick and trench portions of 2 mm wide by 0.1 mm thick. Specifically, trenches of 2 mm wide by 0.2 mm deep were formed vertically (longitudinally) and laterally each at 10-mm intervals on the surface of the 8-inch silicon wafer.

The surface of the simulated COW substrate was coated with each of the filling-component curable compositions, which were prepared in the examples and comparative examples, using a squeegee (J Squeegee (Special Squeegee (ROLL-J Type)), supplied by Newlong Seimitsu Kogyo Co., Ltd.) to form a coating.

The formed coating was visually observed to evaluate the filling properties according to criteria as follows.

Criteria

Very good (VG): both the chip portions and the trench portions were filled, and no bubble remained in the trench portions;

Good: both the chip portions and the trench portions were filled, but bubbles remained in the trench portions; and Fair: the trench portions alone were filled.

The coating was irradiated with UV light (UV-A) at 3600 mJ/cm$^2$ using a UV irradiator (trade name UVC-02516S1AA02, supplied by Ushio Inc.), then heated (post-cured) on a hot plate at 120° C. for 10 minutes, and yielded a filling component.

The resulting filling component was examined on whether there was cracking by visual observation and by optical microscopic observation to evaluate the cracking according to criteria as follows.

Criteria

Good: without cracking; and

Poor: with cracking.

Samples without cracking were each subjected to a polishing test at a number of revolutions of 100 rpm for a polishing time of 10 minutes with a weight of 500 g. The test was performed using a polisher (trade name MA-200D, supplied by Musashino-denshi) and a grinder (trade name CBN DIA #400, supplied by MITSUI GRINDING WHEEL Co., Ltd.). The filling components prepared in Comparative Examples 1 to 4 were found to suffer from cracking and were not subjected to the polishing test.

After polishing, the samples were examined on whether the filling component and the silicon wafer suffered from cracking and/or chipping and whether the grinder suffered from plugging by visual observation and by optical microscopic observation, and the grindability of the samples was evaluated according to criteria as follows.

Criteria

Good: the sample did not suffer from cracking and chipping in the filling component and the silicon wafer, and the grinder did not suffer from plugging; and Poor: the sample suffered from cracking and/or chipping in the filling component and/or in the silicon wafer, and/or the grinder suffered from plugging.

The filling-component curable compositions prepared in the examples and comparative examples were cured under curing conditions as in the test and yielded filling components with a size of 500 mm by 10 mm. Each of the filling components were examined on heat resistance by measuring the glass transition temperature (Tg) using a differential scanning calorimeter (DSC) supplied by Seiko Instruments Inc. In addition, the filling components were examined by measuring the coefficient of thermal expansion (ppm/K) using a thermomechanical analyzer (trade name EXSTAR TMA/SS7100, supplied by SII Nano Technology Inc.) under compression mode.

TABLE 1

| | | Examples | | | | | | | | | | |
|---|---|---|---|---|---|---|---|---|---|---|---|---|
| | | 1 | 2 | 3 | 4 | 5 | 6 | 7 | 8 | 9 | 10 | 11 |
| Curable compounds | Bisphenol-F epoxy resin | 100 | 70 | 70 | 70 | 70 | 70 | 70 | 70 | 70 | 70 | 70 |
| | Bisphenol-A epoxy resin | | | | | | | | | | | |
| | 2021P | | 30 | 30 | 30 | 20 | 30 | 30 | 30 | | | |
| | PB3600 | | | | | 10 | | | | | | |
| | (3,4,3',4'-Diepoxy) bicyclohexyl | | | | | | | | | 30 | 30 | 30 |
| Cationic-polymerization initiators | CPI-100P | 2 | 2 | | | | | | 2 | 2 | 2 | |
| | CPI-101A | | | 2 | 0.23 | 0.23 | | | | | 2 | |
| | LW-S1 | | | | | | 2 | | | | | 2 |
| Others | Silica | | | | | | | 30 | 30 | | | |
| | Silane coupling agent | | | | | | | | 1 | | | |
| Evaluations | Viscosity (mPa·s) | 6000 | 1450 | 1450 | 1450 | 2970 | 1450 | 5200 | 5200 | 1100 | 1100 | 1100 |
| | Filling properties | good | VG | VG | VG | VG | VG | good | good | VG | VG | VG |
| | Cracking | good | good | good | good | good | good | good | good | good | good | good |
| | Grindability | good | good | good | good | good | good | good | good | good | good | good |
| | Tg (°C.) | — | 30 | — | 98 | 55 | — | — | — | — | — | — |
| | Coefficient of thermal expansion (ppm/K) | — | 76 | — | 60 | — | — | 61 | 61 | — | — | — |

| | | Examples | | | | | | | |
|---|---|---|---|---|---|---|---|---|---|
| | | 12 | 13 | 14 | 15 | 16 | 17 | 18 | 19 |
| Curable compounds | Bisphenol-F epoxy resin | 70 | 70 | | | | | | |
| | Bisphenol-A epoxy resin | | | 100 | 70 | 70 | 70 | 70 | 70 |
| | 2021P | | | | 30 | 30 | 30 | 30 | 30 |
| | PB3600 | | | | | | | | |
| | (3,4,3',4'-Diepoxy) bicyclohexyl | 30 | 30 | | | | | | |
| Cationic-polymerization initiators | CPI-100P | 2 | 2 | 2 | 2 | | | 2 | 2 |
| | CPI-101A | | | | | 2 | | | |
| | LW-S1 | | | | | | 2 | | |
| Others | Silica | 30 | 30 | | | | | 30 | 30 |
| | Silane coupling agent | | 1 | | | | | | 1 |
| Evaluations | Viscosity (mPa·s) | 4800 | 4800 | 7200 | 1880 | 1800 | 1800 | 5640 | 5640 |
| | Filling properties | good | good | good | VG | VG | VG | good | good |
| | Cracking | good | good | good | good | good | good | good | good |
| | Grindability | good | good | good | good | good | good | good | good |
| | Tg (°C.) | — | — | — | — | — | — | — | — |
| | Coefficient of thermal expansion (ppm/K) | — | — | — | — | — | — | — | — |

| | | Examples | | | | | Comparative Examples | | | |
|---|---|---|---|---|---|---|---|---|---|---|
| | | 20 | 21 | 22 | 23 | 24 | 1 | 2 | 3 | 4 |
| Curable compounds | Bisphenol-F epoxy resin | | | | | | | | | |
| | Bisphenol-A epoxy resin | 70 | 70 | 70 | 70 | 70 | | | | |
| | 2021P | | | | | | 100 | 100 | | |
| | PB3600 | | | | | | | | | |

TABLE 1-continued

|  |  |  |  |  |  |  |  |  |  |  |
|---|---|---|---|---|---|---|---|---|---|---|
|  | (3,4,3',4'-Diepoxy)bicyclohexyl | 30 | 30 | 30 | 30 | 30 |  |  | 100 | 100 |
| Cationic-polymerization initiators | CPI-100P | 2 |  |  | 2 | 2 | 2 |  | 2 |  |
|  | CPI-101A |  | 2 |  |  |  |  | 2 |  | 2 |
|  | LW-S1 |  |  | 2 |  |  |  |  |  |  |
| Others | Silica |  |  |  | 30 | 30 |  |  |  |  |
|  | Silane coupling agent |  |  |  |  | 1 |  |  |  |  |
| Evaluations | Viscosity (mPa · s) | 1320 | 1320 | 1320 | 5320 | 5320 | 400 | 400 | 210 | 210 |
|  | Filling properties | VG | VG | VG | good | good | fair | fair | fair | fair |
|  | Cracking | good | good | good | good | good | poor | poor | poor | poor |
|  | Grindability | good | good | good | good | good | — | — | — | — |
|  | Tg (° C.) | — | — | — | — | — | — | — | — | — |
|  | Coefficient of thermal expansion (ppm/K) | — | — | — | — | — | — | — | — | — |

The compounds used in the examples and comparative examples are as follows.

Curable Compounds

Bisphenol-F epoxy resin: diglycidyl ether of bisphenol-F-epichlorohydrin, epoxy equivalent: 168 g/eq, trade name RE-303S, supplied by Nippon Kayaku Co., Ltd.

Bisphenol-A epoxy resin: diglycidyl ether of bisphenol-A-epichlorohydrin, epoxy equivalent: 185 g/eq, trade name RE-410S, supplied by Nippon Kayaku Co., Ltd.

2021P: 3,4-epoxycyclohexylmethyl (3,4-epoxy)cyclohexanecarboxylate, trade name CELLOXIDE 2021P, supplied by Daicel Corporation PB3600: epoxidized polybutadiene, trade name EPO-LEAD PB3600, supplied by Daicel Corporation Cationic-Polymerization Initiator CPI-100P: diphenyl-4-(phenylthio)phenylsulfonium hexafluorophosphate, trade name CPI-100P, supplied by San-Apro Ltd.

CPI-101A: diphenyl-4-(phenylthio)phenylsulfonium hexafluoroantimonate, trade name CPI-101A, supplied by San-Apro Ltd.

LW-S1: sulfonium compound, trade name LW-S1, supplied by San-Apro Ltd.

Others

Silica: trade name SC4050-SEJ, having an average particle diameter of 1 μm, supplied by Admatechs Company Limited Silane coupling agent: 3-trimethoxysilylpropyl acrylate

INDUSTRIAL APPLICABILITY

Assume that the filling component according to the present invention for three-dimensional mounting of semiconductor elements is polished from the semiconductor element front side while gaps between laterally adjacent thinned semiconductor elements are filled with the filling component. This flattens the chip front side and gives a thin, low-profile three-dimensional integrated semiconductor device in a good yield.

REFERENCE SIGNS LIST 1 silicon wafer including circuit-forming regions
2 filling component for three-dimensional mounting of semiconductor elements
3 through hole
4 through-silicon via
20, 20' semiconductor element
30 first base wafer
40 semiconductor wafer having two interconnection layers
50 semiconductor wafer having three interconnection layers

The invention claimed is:

1. A curable composition for three-dimensional mounting of semiconductor elements,
  the curable composition comprising:
    an epoxide having a bisphenol skeleton represented by formula (1), (2) or (3)

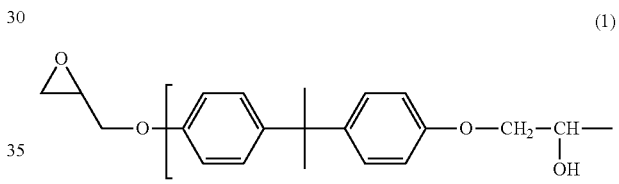

(1)

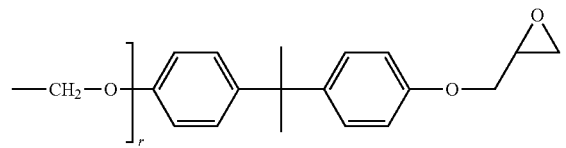

(2)

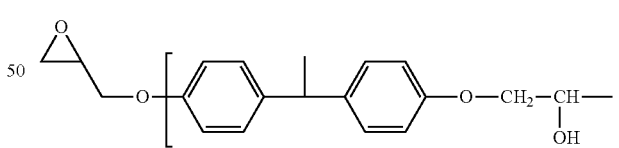

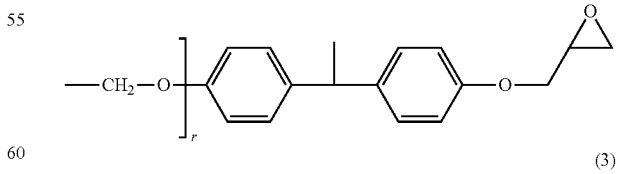

(3)

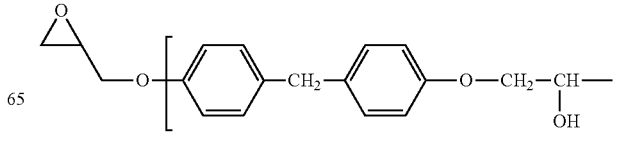

-continued

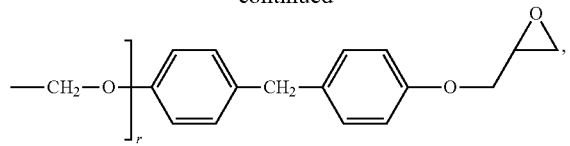

wherein r represents a number of 0 to 8;
a cycloaliphatic epoxide represented by formula (4),

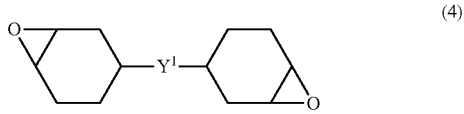

wherein $Y^1$ is selected from a single bond and a linkage group, and the linkage group is selected from the group consisting of divalent hydrocarbon group, carbonyl group (—CO—), ether bond (—O—), ester bond (—COO—), amide bond (—CONH—), carbonate bond (—OCOO—) and combinations thereof; and
a cationic-polymerization initiator,
wherein a ratio in parts by weight of the epoxide having a bisphenol skeleton represented by formula (1), (2), or (3) to the cycloaliphatic epoxide represented by formula (4) in the curable composition is 55:45 to 99:1,
wherein the curable composition does not contain a radical polymerization initiator,
wherein the curable composition is a liquid at 25° C., and
wherein the curable composition is suitable for use in the formation of a filling component.

2. The curable composition according to claim 1 for three-dimensional mounting of semiconductor elements, the curable composition further comprising
at least one filler selected from the group consisting of inorganic fillers and organic fillers each having an average particle diameter of 0.05 to 1 μm.

3. The curable composition according to claim 2 for three-dimensional mounting of semiconductor elements, the curable composition further comprising
a silane coupling agent.

4. The curable composition according to claim 1 for three-dimensional mounting of semiconductor elements, the curable composition further comprising
a silane coupling agent.

* * * * *